United States Patent
Wei et al.

(10) Patent No.: US 8,758,588 B2
(45) Date of Patent: *Jun. 24, 2014

(54) METHOD FOR MANUFACTURING A ONE-DIMENSIONAL NANO-STRUCTURE-BASED DEVICE

(75) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 2155 days.

This patent is subject to a terminal disclaimer.

(21) Appl. No.: 11/371,991

(22) Filed: Mar. 8, 2006

(65) Prior Publication Data

US 2006/0272061 A1  Nov. 30, 2006

(30) Foreign Application Priority Data

Mar. 10, 2005  (CN) .......................... 2005 1 0033605

(51) Int. Cl.
*C25D 13/02*  (2006.01)

(52) U.S. Cl.
USPC ........................................................ 204/490

(58) Field of Classification Search
USPC ........................................................ 204/490
See application file for complete search history.

(56) References Cited

U.S. PATENT DOCUMENTS

| | | | | |
|---|---|---|---|---|
| 4,082,642 A | * | 4/1978 | Honig | 204/434 |
| 4,225,408 A | * | 9/1980 | Barlow et al. | 438/72 |
| 4,246,086 A | * | 1/1981 | Hennicke et al. | 205/86 |
| 5,479,278 A | * | 12/1995 | Takeuchi et al. | 349/187 |
| 6,346,189 B1 | | 2/2002 | Dai et al. | |
| 6,962,823 B2 | * | 11/2005 | Empedocles et al. | 438/3 |
| 7,082,683 B2 | * | 8/2006 | Han et al. | 29/874 |
| 2005/0064618 A1 | | 3/2005 | Brown et al. | |
| 2005/0142978 A1 | | 6/2005 | Yotani et al. | |
| 2007/0033992 A1 | | 2/2007 | Han et al. | |

FOREIGN PATENT DOCUMENTS

| | | |
|---|---|---|
| CN | 1352461 A | 6/2002 |
| CN | 1091544 C | 9/2002 |
| CN | 1538485 A | 10/2004 |
| CN | 1541183 A | 10/2004 |

(Continued)

OTHER PUBLICATIONS

Xue Zeng-Quan, Study on carbon nanotube tips for scaning tunneling microscope, Journal of Chinese Electron Microscopy Society, Oct. 31, 2001, 555-560, vol. 20, Chinese.

(Continued)

*Primary Examiner* — Kishor Mayekar
(74) *Attorney, Agent, or Firm* — Novak Druce Connolly Bove + Quigg LLP

(57) ABSTRACT

A method for manufacturing a one-dimensional nano-structure-based device comprises the steps of: Step (1), preparing a solution (14) containing one-dimensional nano-structures (15); Step (2), providing a pair of electrical conductors (10, 12), the electrical conductors having respective tips (101, 121) arranged to be spaced apart from and opposite to each other; Step (3), applying at least a drop of the solution to the tips of the electrical conductors thereby the tips being interconnected by the solution; Step (4), applying a voltage (16) between the tips thereby at least one one-dimensional nano-structure being connected with at least one of the tips of the electrical conductors; and Step (5), removing the liquid solvent of the solution.

1 Claim, 1 Drawing Sheet

(56) References Cited

FOREIGN PATENT DOCUMENTS

| JP | 2003-287488 | 10/2003 |
|---|---|---|
| JP | 2004323342 | 11/2004 |
| TW | 583138 | 4/2004 |
| WO | WO03060941 | 7/2003 |
| WO | WO2004052489 | 6/2004 |

OTHER PUBLICATIONS

Wu-Xue, Probe of the scanning microscope, Modern Physics, Mar. 20, 2000, 32-33,vol. 12(2), Chinese.

* cited by examiner

METHOD FOR MANUFACTURING A ONE-DIMENSIONAL NANO-STRUCTURE-BASED DEVICE

CROSS-REFERENCE TO RELATED APPLICATIONS

This application is related to a copending U.S. patent application Ser. No. 11/371,994 filed on Mar. 8, 2006 entitled "Method For Manufacturing A One-dimensional Nano-Structure-based Device" with the same assignee, and a copending U.S. patent application Ser. No. 11/371,877 filed on Mar. 8, 2006 entitled "Method For Manufacturing A One-dimensional Nano-structure-based Device" with the same assignee. The disclosures of the above-identified applications are incorporated herein by reference.

BACKGROUND

1. Field of the Invention

The present invention relates to nano-structure-based devices, and particularly to a method for manufacturing a one-dimensional nano-structure-based device.

2. Discussion of the Related Art

In nano technology field, a variety of nano-scale structures (hereinafter called nano-structures), such as carbon nano-tubes, silicon nano-threads, and zinc oxide nano-threads, can be artificially synthesized. Nano-structures have been implemented into numerous fields, such as, field effect transistors, sensors, and atomic force microscopes (AFMs).

For example, as regards the AFM, the probe tip of the AFM generally comprises a nano-structure, such as a bundle of carbon nanotubes or a single carbon nanotube. The carbon nanotube/tubes are generally attached to the probe tip by the following methods: (1) drawing a bundle of carbon nanotubes or a single carbon nanotube out from bundles of carbon nanotubes using the probe tip under an optical microscope; (2) disposing the carbon nanotube/tubes onto the probe tip using another AFM; (3) forming the carbon nanotube/tubes as extensions of the probe tip.

However, the above-mentioned methods have common shortcomings, in that they are complicated processes, require a lot of time, and have low production efficiency.

What is needed, therefore is to provide a method for manufacturing a nano-structure-based device that is easy to control, and which is also less time consuming.

SUMMARY

A method for manufacturing a one-dimensional nano-structure-based device provided herein generally includes the steps of preparing a solution containing one-dimensional nano-structures; providing a pair of electrical conductors each having a tip, the tips thereof being spaced apart from and opposite to each other; applying the solution to the tips of the electrical conductors, the tips thereby being interconnected by the solution; applying a voltage between the two conductors thereby at least one one-dimensional nano-structure being connected with at least one of the tips of the electrical conductors; and removing the liquid solvent of the solution.

These and other features, aspects, and advantages of the present one-dimensional nano-structure-based device will become more apparent from the following detailed description and claims, and the accompanying drawings.

BRIEF DESCRIPTION OF THE DRAWINGS

Many aspects of the present method for making one-dimensional nano-structure-based device can be better understood with reference to the following drawings. The components in the drawings are not necessary to scale, the emphasis instead being placed upon clearly illustrating the principles of the present method. Moreover, in the drawings, like reference numerals designate corresponding parts throughout the several views.

DETAILED DESCRIPTION OF THE PREFERRED EMBODIMENTS

Figure 1:
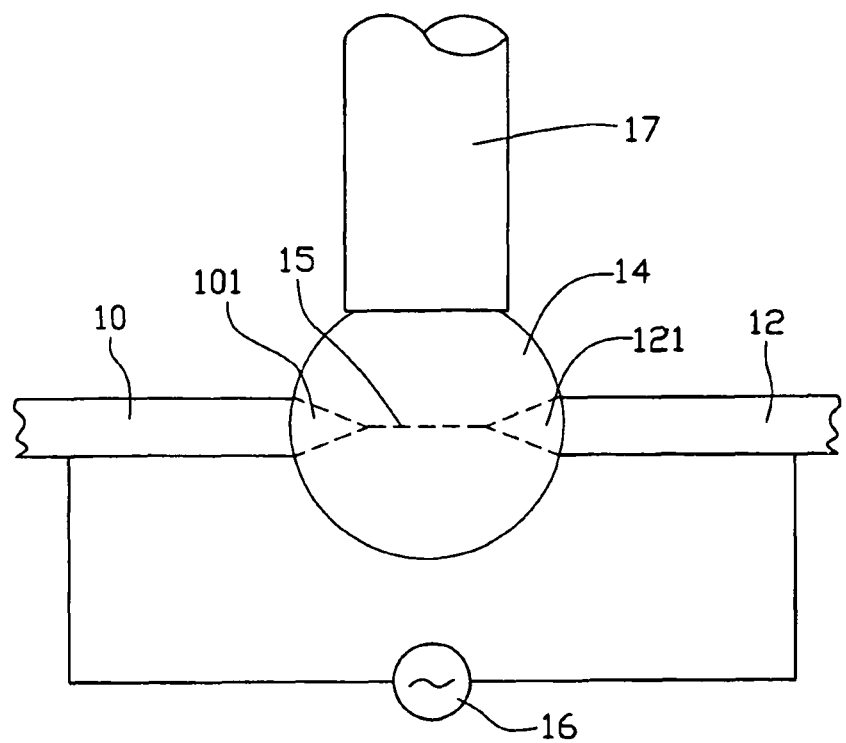
FIG. 1 is a schematic view showing a stage of a method for manufacturing a one-dimensional nano-structure-based device in accordance with one embodiment.

FIG. 1 shows a method for manufacturing a one-dimensional nano-structure-based device in accordance with an exemplary embodiment. It is to be noted that the method may be employed to assemble almost all kinds of one-dimensional nano-structures such as, nanotubes, nano-rods, or nano-threads, so as to create a semi-finished device. The one-dimensional nano-structures are advantageously electrical conductive material. In order to simplify the description of the present embodiment, the steps of the method will be described below in detail, using carbon nanotube as an example of the those kinds of the one-dimensional nano-structures.

In the illustrated embodiment, the method comprises the steps of:

Step (1), preparing a solution 14 containing carbon nanotubes 15 and a liquid solvent;

Step (2), providing a pair of electrical conductors 10, 12, the electrical conductors 10, 12 having respective tips 101, 121; the tips 101, 121 being arranged to be spaced apart from and opposite to each other;

Step (3), applying at least a drop of the solution 14 to the tips 101, 121 of the electrical conductors 10, 12, the tips 101, 121 thereby being interconnected by the solution 14;

Step (4), applying a voltage 16 between the tips 101, 121, at least one carbon nanotube thereby being connected with at least one of the tips 101, 121 of the electrical conductors 10, 12; and Step (5), removing the liquid solvent of the solution 14.

In the illustrated embodiment, the solution 14 contains isopropyl alcohol, and ethyl cellulose. The isopropyl alcohol is used as a main solvent. The ethyl cellulose is used as a stabilizer. The solution 14 is advantageously, but optionally, pretreated using an ultrasonic generator to distribute the carbon nanotubes evenly and uniformly therein before the solution 14 is applied to the tips 101, 121. However, it is to be understood that the solution 14 could be prepared by utilizing other similar suitable solvents and/or stabilizers. Furthermore, other treating steps such as filtrating could be used to obtain the stable uniform solution 14.

It is recognized that the higher the concentration of the carbon nanotubes in the solution 14, the greater the numbers of the carbon nanotubes that may be connected with the tips 101, 121. Thus, the numbers of the carbon nanotubes that is to be subsequently connected between the tips 101, 121 can be controlled by adjusting the concentration of the carbon nanotubes in the solution. If, for example, only one carbon nanotube is desired to connect with the tips 101, 121, the concentration of the carbon nanotubes in the solution should be as low as possible.

In step (2), the electrical conductors 10, 12 is made of a material comprised of tungsten or its alloy. Alternatively, other metals such as gold, molybdenum, platinum, or an alloy thereof could be also utilized instead. The electrical conductors 10, 12 are generally configured to be cylindrical or frustoconical in shape.

The tips 101, 121 are configured to be conical in shape. The tips 101, 121 preferably have a width/diameter in the range from about 10 microns to about 1000 microns. Alternatively, the micro tips 101, 121 could be configured to be frustoconical in shape. If the tips 101, 121 each have flat top surfaces, the micro tips 101, 121 should be arranged with parts of the top surfaces facing each other, for example, edges of the top surfaces facing each other. The distance between the micro tips 101, 121 is generally slightly less than the length of the carbon nanotube 15, this distance is generally below 100 microns. A preferable distance is below 10 microns.

In step (3), at least a drop of the solution 14 is applied between the tips 101, 121 by a syringe 17. The volume of the drop of the solution that is applied to the tips is in the range from about 0.01 to about 0.2 ml. Other suitable apparatus, such as a straw, or a pipet, can also be used instead. It should be noted that the volume of the solution 14 applied to the tips 101, 121 should be sufficient to interconnect the tips 101, 121. Alternatively, the tips 101, 121 could be directly dipped into a container (such as a beaker) having a tiny amount of the solution 14 therein.

In step (4), the voltage 16 is preferably an A.C. (alternating current) voltage 16. The A.C. voltage 16 has a peak value of about 10 volts or less, and has a frequency in the range from about 1000 Hz to about 10 MHz. Generally, the A.C. voltage 16 could be applied for a time period in the range from about several seconds to several tens of seconds, until at least one of the carbon nanotubes 15 is connected with at least one of the tips 101, 121. That is, the method takes relatively little time, and enables a high manufacturing efficiency to be attained.

The present method essentially operates based on the principle of double-directional electrophoresis. Once the A.C. voltage 16 is applied between the electrical conductors, an A.C. electrical field is correspondingly established between the tips of the electrical conductors 10, 12. The carbon nanotubes 15 in the solution 14 are then forced to move toward a direction in which electrical field intensity increases. Accordingly, the carbon nanotubes 15 are stretched and extend toward the tips 101, 121, at which the electrical field intensity is the highest. Eventually, at least one carbon nanotube may be connected with at least one of the tips 101, 121. By the present method, the carbon nanotube 15 can be firmly secured to the tips 101, 121 via Van der Waals attractions therebetween.

Figure 2:
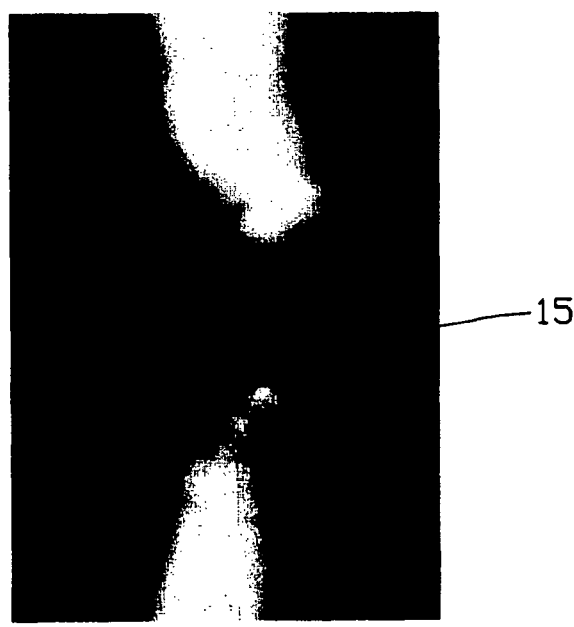
FIG. 2 is an image showing a carbon nanotube interconnected between tips of two electrical conductors, the image being taken using an optical microscopy.

FIG. 2 is an image showing a carbon nanotube 15 interconnected between the tips 101, 121, the image being taken using optical microscopy. Furthermore, the carbon nanotube 15 is stretched to be substantially straight along a longitudinal direction thereof. This is because that the carbon nanotube 15 is polarized by the electrical field, thereby having electrical charges at two ends thereof. During the movement of the carbon nanotube 15 toward the tips 101, 102, the electrical field exerts a force to opposite ends of the carbon nanotube 15. The force stretches the carbon nanotube 15 to be substantially straight.

Thereby, the apparatus having the one dimensional nanomaterial is obtained, and could be utilized in numerous electrical devices, for example, micro sensors.

In step (5), when at least one of the carbon nanotube 15 is connected with the tips 101, 121, the A. C. voltage 16 is switched off, and the liquid solvent of the solution 14 is removed from the tips 101, 121.

Furthermore, if the one-dimensional nano-structure is to be interconnected between the tips of the electrical conductors, the method could further include a step of inspecting whether the one-dimensional nano-material is connected therebetween. For instance, in the illustrated embodiment, a resistor could be connected in series with the electrical conductors 10, 12. An oscillograph is connected in parallel with the resistor for showing an electrical current flowing through the resistor. If the carbon nanotube is interconnected between the tips of the electrical conductors, an electrical current will flow through the carbon nanotube. Therefore, the oscillograph will display a change in the electrical current. At this time, the alternating current voltage 16 is switched off. The liquid solvent of the solution 14 is then removed from the tips 101, 121. It should be understood that otherwise inspecting means could be utilized for the inspecting step, and it is not limited to the illustrated embodiment.

Therefore, the whole process of the method for manufacturing an apparatus having one-dimensional nano-structure could realize automatic operation and inspection. The producing efficiency associated therewith is manifestly improved. Furthermore, since the relative manufacturing machine is simple, the cost of the production is low. It is suitable for mass production of one-dimensional nano-structure-based device.

Finally, while the present invention has been described with reference to particular embodiments, the description is illustrative of the invention and is not to be construed as limiting the invention. Therefore, various modifications can be made to the embodiments by those skilled in the art without departing from the true spirit and scope of the invention as defined by the appended claims.

What is claimed is:

1. A method for manufacturing a one-dimensional nano-structure-based device, the method comprising the steps of:
    preparing a solution containing one-dimensional nano-structures and a liquid solvent;
    providing a pair of electrical conductors each having a tip, the tips thereof being spaced apart from and opposite to each other;
    applying the solution to the tips of the electrical conductors thereby the tips being interconnected by the solution;
    applying a voltage between the two conductors thereby at least one one-dimensional nano-structure being connected with at least one of the tips of the electrical conductors;
    inspecting whether the one-dimensional nano-structure in the liquid solvent is interconnected between the tips; and
    removing the liquid solvent of the solution;
    wherein the tips are spaced apart a distance which is slightly less than a length of a given one-dimensional nano-structure, the inspecting step comprises the steps of connecting a resistor in series with the electrical conductors, and connecting an oscillograph in parallel with the resistance for displaying an electric current flowing through the resistor so as to indicate whether the one-dimensional nano-structure is interconnected between the tips.

* * * * *